United States Patent [19]

Higgs et al.

[11] Patent Number: 4,859,941
[45] Date of Patent: Aug. 22, 1989

[54] PROXIMITY SELECTRO WITH INTEGRAL MAGNET, POLE-PIECE PLATE AND PAIR OF MAGNETIC TRANSDUCERS

[75] Inventors: Jacob K. Higgs, Salisbury, N.H.; Barbara L. Gibson, Dorchester, Mass.

[73] Assignee: Sprague Electric Company, North Adams, Mass.

[21] Appl. No.: 27,363

[22] Filed: Mar. 18, 1987

[51] Int. Cl.[4] .............................................. G01B 7/30
[52] U.S. Cl. ..................................... 324/208; 324/251; 324/262; 324/227; 338/324
[58] Field of Search ............... 324/207, 208, 235, 227, 324/251, 262, 252, 179, 173, 224, 174, 225, 233; 338/32 H, 32 R

[56] References Cited

U.S. PATENT DOCUMENTS

| | | | |
|---|---|---|---|
| 3,359,495 | 12/1967 | McMaster et al. | 324/235 |
| 3,419,798 | 12/1968 | Walton | 324/251 |
| 3,636,767 | 1/1972 | Duffy | 324/174 |
| 4,011,476 | 3/1977 | Beard | 324/179 X |
| 4,180,753 | 12/1979 | Cook, III | 324/208 X |
| 4,204,158 | 5/1980 | Ricouard et al. | 324/208 |
| 4,207,519 | 6/1980 | Zatsepin et al. | 324/235 |
| 4,311,981 | 1/1982 | Luzynski | 338/32 H |
| 4,373,271 | 2/1983 | Nitz | 324/251 X |
| 4,465,976 | 8/1984 | Avery et al. | 324/251 |
| 4,490,027 | 12/1984 | Frank et al. | 324/251 X |
| 4,692,702 | 9/1987 | Huschelrath et al. | 324/251 |
| 4,727,323 | 2/1988 | Zabler | 324/208 X |
| 4,733,177 | 3/1988 | Pawletko | 324/251 X |

FOREIGN PATENT DOCUMENTS

| | | | |
|---|---|---|---|
| 0168381 | 9/1984 | Japan | 324/208 |
| 0168382 | 9/1984 | Japan | 324/208 |

Primary Examiner—Reinhard J. Eisenzopf
Assistant Examiner—Warren S. Edmonds

[57] ABSTRACT

A proximity detector includes a magnet having steel or iron pole piece plates mounted at front and rear pole ends of the magnet, and a silicon integrated circuit mounted to the outer surface of the front pole piece centered about at the magnet pole axis. The integrated circuit includes two essentially identical Hall elements having outputs connected series opposing, i.e. differentially rather than aiding, so that distortion of the magnet field ambient to the integrated circuit caused by a ferromagnetic article passing by results in a gradient field between the Hall elements producing a differential output signal. The dual Hall element integrated circuit leads to a low differential composite offset voltage while the front pole piece renders the magnetic flux density much more uniform further reducing this dual-Hall-element composite offset voltage.

4 Claims, 2 Drawing Sheets

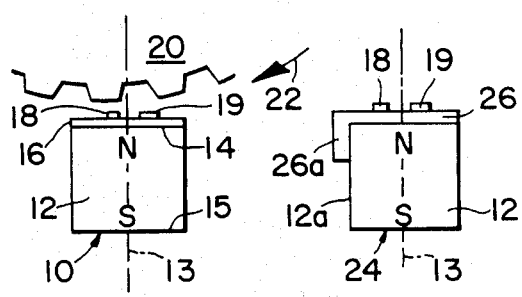
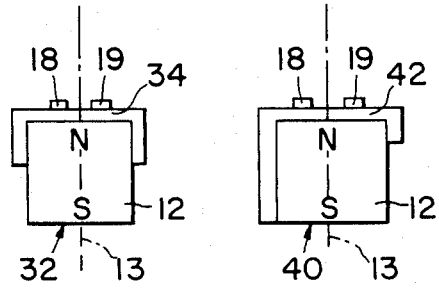
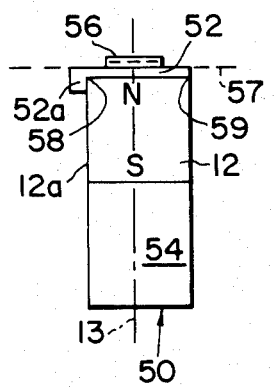
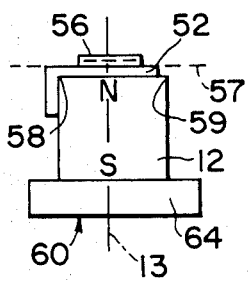
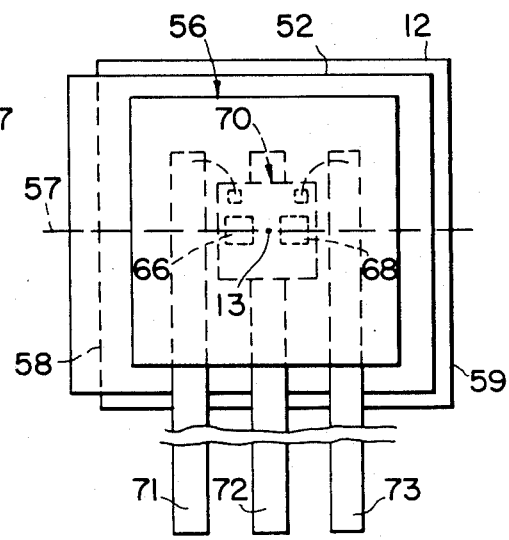
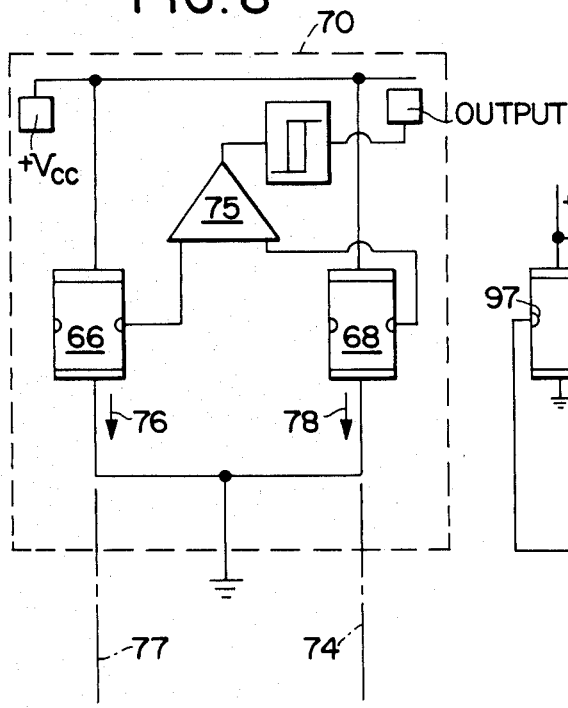
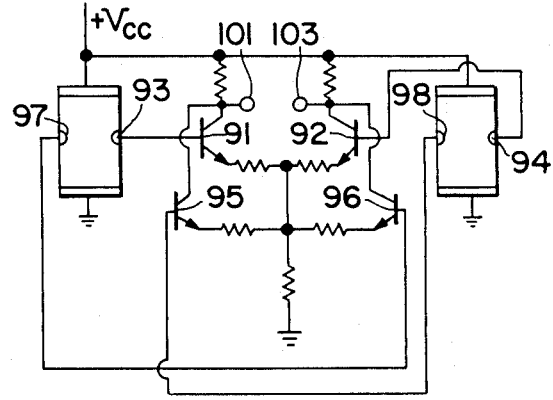

PROXIMITY SELECTRO WITH INTEGRAL MAGNET, POLE-PIECE PLATE AND PAIR OF MAGNETIC TRANSDUCERS

BACKGROUND OF THE INVENTION

This invention relates to a magnet assembly and more particularly relates to a combination of a magnet with a high permeability pole piece mounted at one pole of the magnet to render the magnetic field there more uniform, and to such an assembly further including a dual differential magnetic-field to electrical-signal transducer mounted to the pole piece for detecting the passage of ferroelectric objects.

In the past, high permeability pole pieces of ferrite, iron low carbon steel and the like have been used in conjunction with a magnet to direct and/or concentrate the magnetic field of the magnet in a desired region. The uniformity of the magnetic field at a region near the poles of a magnet has normally been considered quite uniform, at least uniform enough for the uses to which the magnet has to be put.

Proximity sensors are extensively used for detecting the approach of a ferromagnetic body. Many such sensors are comprised of a magnetic field detector mounted at the pole of a magnet. Such a device is described in the patent to G. Avery, US 4,443,716 issued Apr. 17, 1984. In that device the integrated circuit includes a Hall element followed by a differential voltage comparator or Schmitt trigger circuit.

There is also described in another patent to Avery, US 4,518,918 issued May 21, 1985, a magnet having mounted at one pole two integrated circuits each being of the kind including a Hall element followed by an amplifier. The outputs of the two amplifiers are so combined so as to obtain a voltage related to the difference.

However, it has been discovered that the lack of uniformity of the magnet-field at a magnet pole end leads to difficulty in positioning two magnetic sensors there so that in the absence of another ferroelectric object in the vicinity, the magnetic field strength at one sensor element is equal to that at the other.

It is therefore an object of this invention to provide a magnet assembly having a broad region at one pole end that is uniform.

It is a further object of this invention to provide such an assembly having a dual Hall sensor at the one pole producing a sensor difference voltage proportional to the gradient field at that pole that may be attributable to a passing ferromagnetic object.

SUMMARY OF THE INVENTION

A proximity detector for detecting the passing of a ferromagnetic article includes a magnet having north and south pole ends, a front ferromagnetic pole piece means for making more uniform the magnetic field density near the front pole end, and a pair of magnetic-field to electrical-signal transducers mounted side by side on the outer surface of the front pole piece means.

The front pole piece means may be a ferromagnetic plate mounted to the front pole end with or without one or more bent down tab portions next to one or more adjacent magnet sides, respectively.

The pair of transducers may be essentially identical Hall elements, and preferably Hall elements formed simultaneously in an integrated circuit die. The die should have a Hall-elements-energizing means for producing energizing currents, respectively, in each Hall element, which currents are mutually parallel; and the die should include a series opposing connection means to the outputs of the Hall elements for producing a differential output signal that is a function of the magnetic field gradient between the Hall elements.

The above-described proximity detector provides a uniform magnetic field at the front pole end attributable to a pole piece there. This leads to a reduced offset output voltage and makes the relationship of output voltage more directly and predictably dependent upon the changes in field gradient at the transducers that are attributable to the approach or passing of a ferromagnetic object.

BRIEF DESCRIPTION OF THE DRAWINGS

FIG. 1 shows in a side view a proximity detector 10 of this invention comprised of a magnet 12, a front pole piece or plate 16, and a pair of magnetic-field to electrical- signal transducers 18 and 19.

FIG. 2 shows in a side view a proximity detector 24 of this invention differing from that of FIG. 1 in that the front pole piece 26 additionally has a tab portion 26a extending downward and adjacent one side 12a of the magnet 12.

FIG. 3 shows in a side view a proximity detector 32 of this invention including a U-shaped front pole piece 34.

FIG. 4 shows in a side view a proximity detector 40 of this invention including a J-shaped front pole piece 42.

FIGS. 5 and 6 show in side views proximity detectors 50 and 60 of this invention including both front pole piece 52 and rear pole pieces 54 and 64.

FIG. 7 shows magnified in top view the proximity detector of FIG. 5.

FIG. 8 shows a block diagram of the dual transducers integrated circuit chip 70 of FIG. 7.

FIG. 9 shows a circuit diagram of a dual transistors Hall voltage amplifier of this invention.

DESCRIPTION OF THE PREFERRED EMBODIMENTS

Figure 10:
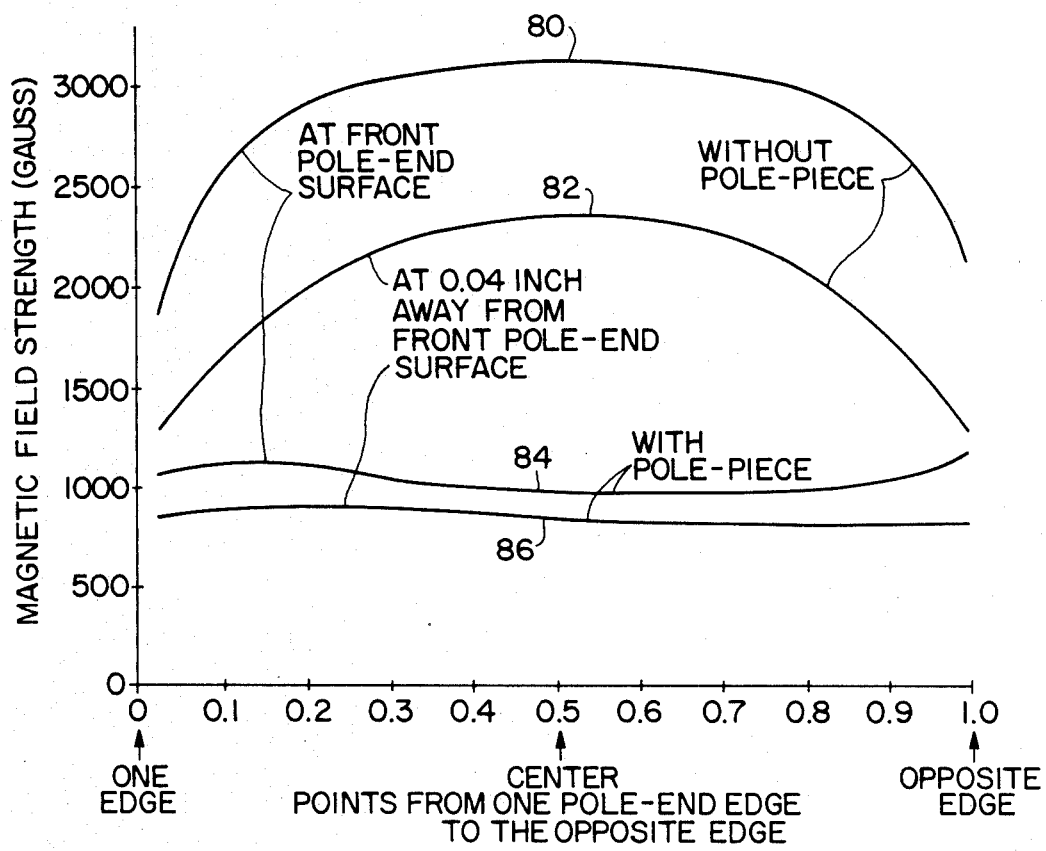
FIG. 10 shows magnetic field strength at points along a magnet pole end with and without a pole piece.

The proximity detector 10 of FIG. 1 includes a magnet 12 composed of a samarium cobalt cube each end or side of which is a square 0.320 inch ×0.320 inch. the magnet axis 13 is defined as passing through the center of the north-pole end 14 and the south-pole end 15. A low carbon steel plate 16 serving as a front pole piece and having a relative magnetic permeability of greater than 1000 at from 1 to 5 kilogauss is mounted to the north pole end 14 of the magnet 12. Two magnetic-field to electrical-signal transducers 18 and 19 are mounted to the outer surface of the front pole piece 16.

A ferromagnetic gear 20 is mounted above the proximity detector 10 and turns, e.g. in the direction shown by arrow 22, so that the gear teeth pass closely by transducers 18 and 19.

Variations in shape of front pole pieces 26, 34 and 42 are illustrated in FIGS. 2, 3 and 4.

FIGS. 5 and 6 show proximity detectors 50 and 60 both having an L-shaped front pole piece 52. Two relative sizes of rear pole pieces 54 and 64 are illustrated. Also in detectors 50 and 60 there is employed an integrated circuit package 56 that includes two side by side Hall elements 66 and 68 as illustrated in FIG. 7. As shown in FIGS. 5, 6 and 7, the two Hall elements 66 and 68 lie along a line 57 that is orthogonal to the magnet corner 58. The bent down extended portion 52a of the front pole piece 52 is adjacent magnet side 12a and the Hall-element alignment line 57 is in a direction that is perpendicular to the magnet side 12a.

Referring to FIG. 8, the silicon integrated circuit 70, in which the Hall elements 66 and 68 are formed, may be made by a process such as that described by J. Macdougall in U.S. 4,253,107 issued Feb. 24, 1981 and may advantageously follow the structural principles taught in the patent to Higgs and Humenick U.S. 4,578,692 issued Mar. 25, 1986. These patents are assigned to the same assignee as is the present invention. The package 56 is of standard construction which includes leads 71, 72 and 73 having been cut out of a copper lead frame (not shown). The silicon chip has its substrate back mechanically and electrically connected to a circuit-ground lead 72, and a protective molded body encompassing lead ends and the integrated circuit chip 56.

In addition to the Hall transducers 66 and 68, the integrated circuit 70 also includes a differential amplifier 75 with inputs connected to outputs of the two Hall elements, respectively, to amplify the difference and not the sum of the two transducer output signals. those transducer signals will be equal and the differential input to the amplifier 75 will be zero under the conditions that: (a) the Hall elements 66 and 68 are essentially identical, or, more generally, they have the same transducer sensitivity; (b) the magnet generated field is of equal magnitude at transducer 68 as it is at transducer 66 in the absence of other nearby ferromagnetic articles; (c) the offset voltages of the two Hall elements 66 and 68 are essentially zero; and (d) there are present nearby (e.g. within an inch), no other ferromagnetic articles.

This invention is particularly concerned with (b) the provision of a uniform magnet-generated field in a central region at the magnet pole end where the differential-transducers output voltage (at the differential amplifier input) is not critical because it is not a function of the position of the transducers within that central pole-end region.

Solutions for achieving a near zero off-set Hall voltage (c) is taught in the above-noted patent US 4,578,692.

The problem (a) of making two nearly identical Hall elements is greatly reduced by making both simultaneously and on the same semiconductor die and so in the practice of the present invention the use of a dual-Hall-transducers integrated circuit is greatly preferred.

The dual-Hall-transducers integrated circuit also offers an advantage toward further reducing the offset voltage (c) because the Hall elements are very nearly identical (a). The offset voltage of a Hall element is that which appears between the output contact regions with no magnetic field present. Offset voltage is generated in proportion to the inadvertant physical displacement from perfect symmetry of the contact regions usually owing to mask misregistration. The mask determining positions of contact areas of two Hall elements will likely be displaced the same amount in the same direction at both Hall elements. The series opposing (differential) connection of these Hall contacts in the unique integrated circuit described here will tend to buck out the offset voltages from the two Hall elements that is attributable to mask misalignment. Furthermore, this integrated circuit need only include one voltage regulator (not shown) from which both Hall elements are energized, whereas the conventional integrated Hall proximity detector includes one Hall element and one regulator. Thus, a pair of conventional integrated Hall detectors are more expensive and are likely to have a greater differential offset voltage because of separate voltage regulator energizing sources generating non-identical voltages.

For most of these benefits and advantages to be realized, the two side-by-side Hall elements of the integrated circuit of this invention must be oriented in the semiconductor chip with their axes 77 and 74 about mutually parallel as shown in FIG. 8 and being connected so that their energizing currents 76-78 flow in the same direction.

The differential amplifier of FIG. 9 has a pair of differentially connected transistors 91 and 92 with bases connected to the right-most Hall output contacts 93 and 94. A pair of differentially connected transistors 95 and 96 have bases connected to left-most Hall output contacts 97 and 98, respectively. These transistor pairs share collector loads and produce a differential output voltage between terminals 101 and 103.

The pole-end field of the bare samarium cobalt magnet 12 was explored by moving a magnetic field sensing probe across the surface of the north pole end 14 from the edge at corner 58 to the opposite edge at corner 59. A plot of that magnetic field magnitude is shown in FIG. 10 by curve 80. The probe was then again moved across the pole end 14 but spaced away from it by 0.04 inch to produce curve 82 in FIG. 10.

It is there made clear that the mounting of a dual differential magnetic field detector either to or slightly spaced away from the bare magnet pole end (14) will likely result in a non-zero differential output signal unless the one position is found at which the dual sensor sees a uniform field.

The experiment was repeated again with the addition of the pole piece 26 as seen in FIG. 2. Pole piece 26, in this case, is 0.02 inch thick and has a tab that is 0.160 inch long. The magnetic field sensing probe was moved over the outer top surface of the pole piece 26 starting at the left magnet corner 58, generating the curve 84 that in a center region shows a relatively uniform magnetic field compared to that (curve 80) without pole piece 26. The probe was then used to scan the field at 0.040 inch above the pole piece surface producing curve 86.

Field measurements of this kind were also made using pole pieces of other configurations. A summary of this data is shown in Table I in which the width (along line 57) of the central region for which the field varied less than ±10 gauss is presented. This width is used as a figure of merit, the wider of such regions make less critical the physical positioning of the magnetic-field to electrical-signal transducers for least differential "offset" voltage. The width of the uniform field (±10 gauss) regions is given in mils (thousanth of an inch or 25 microns). The probe measurements are made at 20 mils away and 40 mils away from the bare magnet or pole piece outer surface as the case may be. These dimensions approximate the actual distances at which a packaged Hall device is actually separated from the mounting surface.

TABLE I

| Pole Piece | | | Width of uniform field region (mils) | | | |
|---|---|---|---|---|---|---|
| Numeral | FIG. | Thickness (mils) | TAB Length (mils) | 20 mils away (mils) | | 40 mils away (mils) |
| none | — | — | — | 40 | 2775 | 30 | 2400 |
| 16 | 1 | 60 | — | 70 | | 100 | |
| 26 | 2 | 60 | 40 | 90 | | 120 | |
|  | 2 | 60 | 80 | 130 | | 190 | |
|  | 2 | 60 | 160 | 130 | | 100 | |
|  | 2 | 60 | 320 | 130 | | 90 | |
| 16 | 1 | 40 | — | 70 | | 100 | |
| 26 | 2 | 40 | 40 | 70 | | 190 | |
|  | 2 | 40 | 80 | 90 | | 130 | |
|  | 2 | 40 | 160 | 70 | | 100 | |
|  | 2 | 40 | 320 | 70 | | 100 | |
| 16 | 1 | 20 | — | 60 | 1686 | 80 | 1590 |
| 26 | 2 | 20 | 40 | 60 | | 120 | |
|  | 2 | 20 | 80 | 60 | 1400 | 110 | 1390 |
|  | 2 | 20 | 160 | 60 | 1490 | 130 | 1390 |
|  | 2 | 20 | 320 | 60 | 1550 | 140 | 1410 |

In another series of tests, more closely related to the intended use as a ferroelectric-article proximity detector, the magnet 12 was fixed in an adjacent relationship with a rotating steel gear 20 as shown in FIG. 1. The air gap between the outer surface of the pole piece 16 (or north-pole-end of the bare magnet with no pole piece) was set at 40 mils for one group of measurements and at 100 mils for another. The width of the gear teeth is 0.34 inch and the distance between teeth is about the same.

The magnetic field sensing probe was mounted in the air gap along the magnet axis 13 and adjacent the gear such that the gear teeth pass by it one by one. The maximum change in one polarity in magnetic flux density $\Delta B$ (occurring once for each tooth) was recorded for a variety of pole pieces. This data is shown in Table II.

TABLE II

| Front Pole Pieces | | | | Peak change in flux density ($\Delta B$) | |
|---|---|---|---|---|---|
| Numeral | FIG. | Thickness (mils) | TAB Length (mils) | 40 mil Air Gap (gauss) | 100 mil Air Gap (gauss) |
| none | — | — | — | 810 | 270 |
| 16 | 1 | 60 | — | 970* | 330* |
| 26 | 2 | 60 | 40 | 630 | 290* |
|  | 2 | 60 | 80 | 680 | 250 |
|  | 2 | 60 | 160 | 500 | 180 |
|  | 2 | 60 | 320 | 410 | 160 |
| 16 | 1 | 40 | — | 1090* | 370* |
| 26 | 2 | 40 | 40 | 850* | 310* |
|  | 2 | 40 | 80 | 830* | 310* |
|  | 2 | 40 | 160 | 830* | 310* |
|  | 2 | 40 | 320 | 800 | 290* |
| 16 | 1 | 20 | — | 1120* | 380 |
| 26 | 2 | 20 | 40 | 1150* | 380* |
|  | 2 | 20 | 80 | 1120* | 370* |
|  | 2 | 20 | 160 | 600 | 210 |
|  | 2 | 20 | 320 | 580 | 210 |
| 34 | 3 | 40 | 320 & 320 | 500 | 190 |
| 42 | 4 | 40 | 320 & 160 | 740 | 280* |

No only do all the front pole pieces tried increase the span of a uniform field region ($\pm 10$ gauss) at the magnet but all of the front pole pieces tried decrease the average magnitude of flux density at the magnet/pole piece surface. It is thus surprising to discover that some pole pieces may actually increase the peak changes in flux density, $\Delta B$ (those marked by asterisk * in Table II).

It is further gratifying that a large $\Delta B$ exists for air gaps as great as 100 mils, providing a significant advantage over single Hall proximity sensors of the prior art that do not give reliable signals at such distances away from a timing gear. Timing gears may rotate eccentrically for a variety of reasons and the capability for proximity sensing at this nominally large air gap is a real practical advantage.

From these data, it can be seen that for use in a proximity sensor of this invention, the simple plate front pole piece (16) causes the least reduction in magnetic field strength at the transducers and is most effective if its thickness exceeds 0.03 inch. However, the L-shaped pole pieces (26) are usually preferable when the pole piece is about 0.030 inch thick or less and when the tab length is less than 0.080 inch. In such cases, little sensitivity is sacrificed while uniformity of field at the transducers is significantly enhanced by these plate and L-shaped pole pieces. On the other hand, the U-shaped pole piece 34 and the J-shaped pole piece 42 generally do not offer as good overall performance though with shorter tabs they may perform better than indicated here.

From these and other data it has been observed that the addition of a rear pole piece, in combination with any front pole piece, provides aobut 6-20% increase in front pole end-magnetic field density, and this improvement in sensitivity is effected with essentially no change in field uniformity. Also, rear pole pieces that provide a 10% greater field at the transducers surprisingly make possible about an increase of 20% in size of the maximum practical air gap (front pole piece to the passing ferromagnetic article to be detected).

There is relatively little enhancement in central-region-field intensity at the magnet axis by using a 20 mil thick L-chaped front pole piece (26) instead of a simple 20 mil thick plate (16), although as has been noted, the L-shaped front pole pieces are preferred when pole piece thickness is greater. However, it was surprisingly found that for 20 mil thick front pole pieces, an L-shaped pole piece with a tab about ⅛ the length of the magnet between pole ends, the maximum practical "air gap" between the pole piece and passing gear teeth is 20% greater than for a simple 20 mil thick plate with no tab using the same integrated circuit (70). It is thus postulated that L-shaped front pole pieces 20 mils thick will have an optimum tab length at from about 1/16 to 3/16 the magnet length.

Referring to Table III, several rectangular steel plate pole pieces like those 54 and 64 shown in FIGS. 5 and 6 were mounted to the rear pole-end of the assembly wherein the front pole piece was always the L-shaped one having a thickness of 60 mils and a tab length of 80 mils. The "width" (or lateral dimension as shown) of these pole pieces was taken parallel to the direction of the Hall-elements alignment line 57, whereas the rear-pole-piece "depth" (or vertical dimension as shown) was taken at right angles to and away from the direction of the alignment line 57, and is in all cases 330 mils except for the last two marked "" which are 500 mils and 1000 mils, respectively. The third rear pole piece dimension (not illustrated) taken in a direction perpendicular to the plane of the paper as shown is in all cases 330 mils, except is 390 and 775 mils, respectively, for the last two marked "". Increases in peak flux densities $\Delta B$ result from increasing any and all of the width, breadth and thickness dimensions of the rear pole piece. Also, the addition of a rear pole piece has no substantial effect upon the field uniformity near the front pole end.

TABLE III

| | Rear Pole Pieces | | Peak change in flux density (ΔB) | |
| --- | --- | --- | --- | --- |
| | | | 65 mil | 100 mil |
| Num-eral | FIG. | Depth (mils) | Width (mils) | Air Gap (gauss) | Air Gap (gauss) |
| 26/— | 2 | — | 330 | 391 | 232 |
| 26/54 | 5 | 250 | 330 | 400 | n.a. |
| | | 500 | 330 | 438 | 262 |
| | | 1000 | 330 | 468 | 280 |
| 26/64 | 6 | 250 | 500** | 444 | 263 |
| | | 250 | 1000** | 510 | 297 |

What is claimed is:

1. A proximity detector for detecting a ferromagnetic article passing by a side of said detector comprising:
    a magnet having north and south pole ends, said magnet being oriented with one of said pole ends at said detector side;
    a ferromagnetic pole piece consisting of a plate portion with one of the two major plate surfaces mounted adjacent to said one pole end and one extending portion;
    a single silicon integrated circuit comprising a pair of side-by-side Hall elements mounted to the outer and opposite major plate surface so that the difference in electrical output signals of the two transducers respectively is a function of the nearness of approach of the passing ferromagnetic article, a differential amplifier means connected to the outputs of said Hall elements for amplifying the Hall elements'difference signal, and a Schmitt-trigger circuit having an input connected to the output of said amplifier means;
    said magnet having one corner formed by said one pole end and an adjacent side, said one extending portion being adjacent to said one side of said magnet, said one magnet corner being about orthogonal to a line passing through the centers of said side-by-side Hall elements.

2. The proximity detector of claim 1 wherein the energizing current axes of said Hall elements are mutually parallel, said proximity detector additionally comprising a Hall-element energizing-current distribution means for supplying energizing current in the same direction to each of said two Hall elements respectively.

3. The proximity detector of claim 1 wherein the longest dimension of said one extending portion in the direction away from said one corner is less than half the average dimension of said plate portion in the direction of said orthogonal center line.

4. The proximity detector of claim 3 wherein the thickness of said front-pole-piece plate portion is less than 0.03 inch and said one extending portion is shorter than 0.08 inch in the direction parallel to the axis of said magnet.

* * * * *

UNITED STATES PATENT OFFICE
CERTIFICATE OF CORRECTION

Patent No. 4,859,941　　　　Dated August 22, 1989

Inventor(s)　Jacob K. Higgs et al

It is certified that error appears in the above-identified patent and that said Letters Patent is hereby corrected as shown below:

Cover Page, under "[54] and in Column 1", the title should
　　read -- PROXIMITY DETECTOR WITH INTEGRAL MAGNET,
　　　　POLE-PIECE PLATE AND PAIR OF MAGNETIC
　　　　TRANSDUCERS --

Cover Page, under "[56] References Cited -- U.S. PATENT DOCUMENTS", the following U.S. patents should be listed:

```
  -- 3,846,697    11/1974    Cila et al      324/228
     2,942,177    6/1960     Neumann et al   324/228
     4,518,918    5/1985     Avery           324/208  --
```

Column 2, line 48, "the" should read -- The --
Column 3, line 25, "those" should read -- Those --
Column 6, line 25, "aobut" should read -- about --

Signed and Sealed this

Twenty-ninth Day of May, 1990

Attest:

HARRY F. MANBECK, JR.

Attesting Officer　　Commissioner of Patents and Trademarks